United States Patent [19]
Pierre et al.

[11] Patent Number: 4,873,868
[45] Date of Patent: Oct. 17, 1989

[54] FORCE MEASUREMENT SENSOR INTEGRATED ON SILICON, AND A METHOD OF MANUFACTURE

[75] Inventors: Andre Pierre, Lyon; François Batllteu, Rambouillet; Jean-Pierre Brosselard, Paris; Alfred Permuy, Marseille; Francois-Xavier Pirot; Serge Spirkovitch, both of Paris, all of France

[73] Assignee: Metravib R.D.S., Ecully Cedex, France

[21] Appl. No.: 162,329

[22] PCT Filed: Jun. 10, 1987

[86] PCT No.: PCT/FR87/00206
§ 371 Date: Feb. 9, 1988
§ 102(e) Date: Feb. 9, 1988

[87] PCT Pub. No.: WO87/07729
PCT Pub. Date: Dec. 17, 1987

[30] Foreign Application Priority Data
Jun. 10, 1986 [FR] France .................. 86 08525

[51] Int. Cl.⁴ .................. G01P 15/08; G01P 15/125
[52] U.S. Cl. .................. 73/517 R; 73/861.68
[58] Field of Search .............. 73/517 R, 651, 862.68; 361/283

[56] References Cited
U.S. PATENT DOCUMENTS

| | | | |
|---|---|---|---|
| 4,342,227 | 8/1982 | Peterson et al. | 73/517 R |
| 4,483,194 | 11/1984 | Rudolf | 73/517 R |
| 4,507,705 | 3/1985 | Hoshino | 361/283 |
| 4,571,661 | 2/1986 | Hoshino | 361/283 |
| 4,670,092 | 6/1987 | Montamedi | 73/517 R |
| 4,672,849 | 6/1987 | Hoshino | 361/283 |

OTHER PUBLICATIONS

Gray, Paul R., Meyer, Robert G., *Analysis and Design of Analog Integrated Circuits*, Second edition, 1984, pp. 46–67, 124–133.

Primary Examiner—John Chapman
Assistant Examiner—Robert P. Bell
Attorney, Agent, or Firm—Bacon & Thomas

[57] ABSTRACT

A mechanical magnitude sensor integrated on silicon, and a method of manufacture. The sensor comprises a bendably deformable conductive blade (4) whose free end (43) constitutes the first plate of a variable capacitor whose fixed second plate (24) is constituted by a conductive zone formed on the silicon substrate. A JFET type structure is formed in the vicinity of the anchor point (41) of the blade (4) with a gate zone (21) situated beneath the anchor portion (41) and with drain and source zones (22, 23) being provided on either side of the gate zone (21) in order to amplify a signal representative of variations in the position of the flexible blade (4). The sensor may be used as an accelerometer or as a pressure sensor.

7 Claims, 3 Drawing Sheets

FORCE MEASUREMENT SENSOR INTEGRATED ON SILICON, AND A METHOD OF MANUFACTURE

TECHNICAL FIELD

The present invention relates to a mechanical magnitude sensor integrated on silicon, comprising a monocrystaline silicon substrate having a first type of doping (A), a variable capacitor comprising a moving first plate constituted by the free end of a conducting blade which is deformable in bending and which is mounted so as to have a cantilevered portion, and a fixed second plate constituted by a conducting zone made on the fixed free surface of the sensor facing said first plate and separated therefrom by an empty space which is a few microns across, and means for detecting a meaningful electrical signal representative of variations in the position of said flexible blade.

PRIOR ART

It is already known to provide integrated force measurement sensors of this type for measuring forces, accelerations, or pressures, and comprising a small cantilevered beam formed in a silicon chip in order to constitute, within an integrated circuit, an element which is sensitive to accelerations perpendicular to the surface of the silicon chip in order to give rise to variations in the capacitance of a variable capacitor, and thereby make it possible to deliver an electrical signal representative of the measured magnitude by detecting variations in the capacitance.

The provision of a sensor which is integrated on silicon makes it possible to increase cmopatibility with the digital processing electronic circuits that are associated with the sensors. However, prior art capacitive effect integrated force measurement sensors suffer from drawbacks insofar as the means for detecting the variations in the capacitance of the variable capacitor having one of its plates constituted by a flexible blade make use of MOS (metal-oxide-semiconductor) type structures which do not make it possible to obtain measurements of sufficient reliability or accuracy because of stray capacitance, drift over time, a relatively high degree of noise, and because of the impossibility of imposing a low cutoff frequency.

Also, it is difficult to manufacture sensors which incorporate a cantilevered blade situated at a very small distance from the substrate, e.g. a few microns, and it is often difficult to prevent the blade sticking on the substrate (or to unstick it therefrom) due to the attraction between two zones of different doping when the distance between said two zones is very small.

SUMMARY OF THE INVENTION

The present invention seeks to remedy the above-mentioned drawbacks and to make it possible to provide a force measurement sensor integrated on silicon, with the fabrication and the size of the sensor being compatible with electronic integrated circuit technology, which sensor can be fabricated accurately and safely, and whose sensitivity and reliability are improved so as to enable accurate measurements to be performed even under difficult environmental conditions.

These aims are achieved by means of a sensor of the type defined at the beginning of the description and characterized in that the substrate is covered on at least a portion of its surface in a doped layer having a second type of doping (B), in that said deformable conductive blade has a conducting anchor portion applied to a localized zone of said doped layer, in that the sensor includes, in said doped layer, a first doped zone which is doped with a high concentration of impurities of the first type (A+) situated in said localized zone for anchoring the flexible blade in order to constitute the gate G of a junction field effect transistor (JFET), second and third doped zones which are doped with a high concentration of impurities of the second type (B+) situated on either side of said first doped zone to constitute the drain D and source S zones of the JFET, the doped layer defining a zone having a low concentration of impurities of said second type (B) situated beneath said first doped zone between said second and third doped zones in order to constitute the channel of said JFET whose gate G is directly connected via the flexible blade to the moving plate of the variable capacitor.

The flexible blade may advantageously be made of polysilicon doped to make it conductive.

In a first embodiment, said subjacent conductive zone is constituted by a fourth doped zone which is doped with a high concentration of impurities of the second type (B+) and made directly in the substrate.

In a second embodiment, said subjacent conductive zone is constituted by a fourth doped zone which is doped with a high concentration of impurities of the first type (A+) and made in the doped layer.

The sensitivity of the sensor may be further improved if it comprises a JFET made in a ring with a drain or source second zone which constitutes a central zone, a gate first zone which surrounds the central drain or source zone in noncontiguous manner, a source or drain third zone which itself surrounds the gate first zone in non-contiguous manner, a peripheral conductive zone which is disposed in non-contiguous manner outside the source or drain third zone, a channel zone situated in the gaps between the second and first zones, between the first and third zones, and beneath said zones, and if the flexible blade has a cantilevered portion which extends radially outwardly from the first zone towards the conductive zone.

In this case, the sensor may comprise a plurality of flexible blades extending radially outwardly from an anchor zone constituted by a ring superposed over the first zone, and conductive zones which are equal in number to the number of flexible blades and which are mutually non-contiguous, with respective free end terminal portions of the flexible blades extending thereover.

In a particular embodiment which makes it easy to reestablish the integrity of the sensor without dismantling the housing, after a shock has caused the flexible cantilevered beam to stick to the substrate, the flexible blade has a cantilevered portion constituted by a set of staircase steps each of which is shorter than a critical sticking length, each staircase step co-operates with a doped zone having a high concentration of impurities situated beneath said step and capable of being individually biased, and means are provided for successively applying a bias voltage to each individually biasable doped zone going from zone to zone of the flexible blade starting with the free end thereof, thereby enabling successive steps to be unstuck in the event of the free portion of the flexible blade becoming accidentally stuck to the substrate.

The invention is also applicable to sensors having a flexible blade that is not cantilevered, with such a sensor being constituted by a symmetrical association of two sensors in accordance with the invention in which the free end portions of the flexible blades are interconnected in order to constitute a single flexible blade which is anchored at both ends.

The invention also provides a method of manufacturing a force measurement sensor as defined above, characterized in that the conductive zone and the first, second, and third doped zones having a high concentration of impurities are made in a first step in the doped layer, in that a layer of silica is then formed after an optional passivation layer has been made, in that the silica in the anchor zone of the flexible blade is then removed by photoetching, in that a conductive material is disposed in the anchor zone and over a portion of the silica layer in order to constitute the flexible blade, in that a load is optionally formed at the free end of the flexible blade, in that contacts are opened through the silica layer and the optional passivation layer, and aluminum is then deposited and photoetched in order to provide conductive connection paths, in that chips are cut from the wafer, are installed in packages, and connections made to their tabs, and in that the silica is removed in a final stage including the silica beneath the cantilevered portion of the flexible blade of conductive material by means of anhydrous gaseous hydrofluoric acid at a temperature lying between about 50° C. and about 200° C. and preferably lying between 50° C. and 100° C. so as to prevent the formation of liquid on the chip.

BRIEF DESCRIPTION OF THE DRAWINGS

Other characteristics and advantages of the invention appear from the following description of particular embodiments given by way of example with reference to the accompanying drawings, in which:

FIG. 1 shows a first example of a mechanical magnitude sensor which is integrated on silicon and which is suitable, for example, for constituting an accelerometer.

Figure 1:
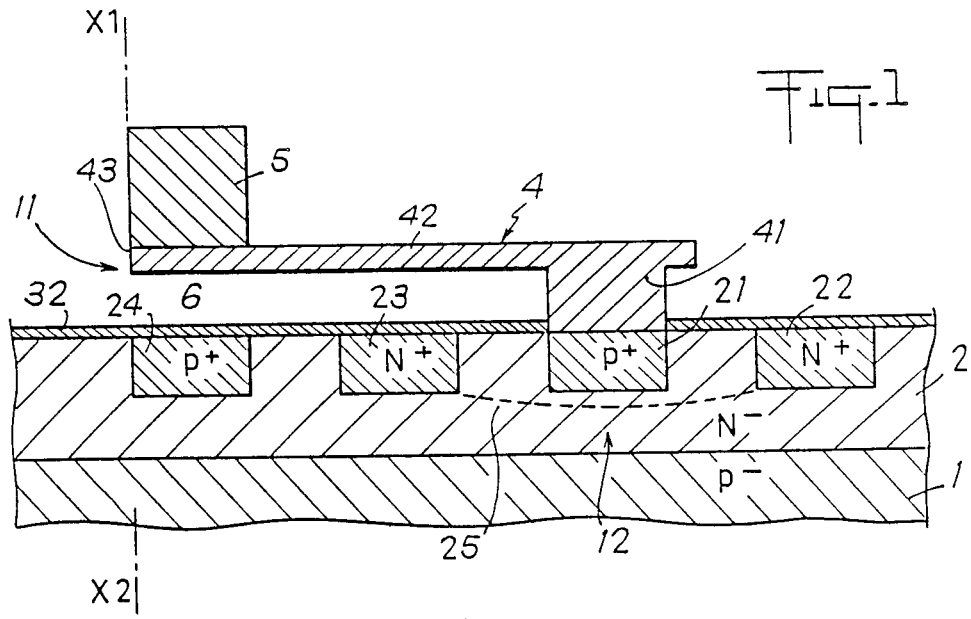
FIG. 1 is a diagrammatic section view showing a first embodiment of a sensor in accordance with the invention.

The sensor comprises a blade 4 which is deformable in bending and which is made of polycrystaline silicon in such a manner as to be conductive. The blade 4 has one end 41 connected to the substrate 1, 2 made of monocrystaline silicon in order to form a conductive anchor portion, a cantilevered portion 42 which constitutes the deformable portion of the blade, and a free end portion 43 which defines a moving first plate of a capacitor 11 (see FIG. 3). The distance of the moving portion 42, 43 of the deformable blade 4 from the free surface of the sensor is about one or a few microns.

Figure 3:
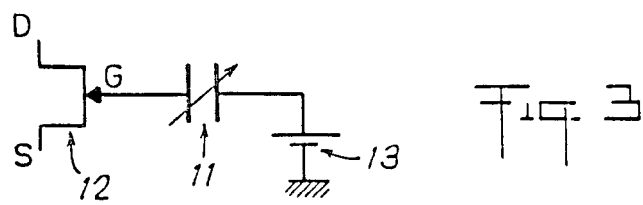
FIG. 3 is a symbolic diagram of the equivalent circuit of a sensor in accordance with the invention.

In the FIG. 1 example, a layer 2 of N-type silicon is formed epitaxially over the entire surface of the substrate per se 1 which is constituted by P-type monocrystaline silicon. A zone 24 has silicon-doping impurities diffused therein to form a p+ doped zone in the epitaxial layer 2 beneath the free end 43 of the blade 4 and constitutes the fixed plate of the variable capacitor 11 comprising the moving plate 43, the fixed plate 24, and the empty space 6 situated between the moving plate 43 and the free surface of the sensor. In the FIG. 1 example, the free surface of the sensor is defined by a passivation layer 32 which is constituted, for example, by silica ($SiO_2$) covered in silicon nitride ($Si_3N_4$). However, the passivation layer is not essential and it may be omitted as in the embodiment shown in FIG. 8. A bias voltage is applied from outside the sensor structure between the substrate 1 and the zone 24 constituting the fixed plate of the capacitor 11, by means of a D.C. voltage source 13, and where applicable a modulating voltage may be superposed thereon (FIG. 3).

Referring again to FIG. 1, it can be seen that the anchor zone 21 on which the anchor portion 41 of the blade 4 is disposed is itself constituted by a p+ type zone which constitutes the grid of a junction field effect transistor (JFET) 12. The JFET 12 comprises a low concentration diffused zone 25 which forms a part of the epitaxial layer 2 and is of opposite sign N to the grid (of p+ type), and constitutes a channel which has a drain zone 22 and a source zone 23 at opposite ends thereof, like all JFETs, which zones have N+ doping of the same sign as the channel and have appropriate bias voltages applied thereto from outside (not shown in the FIG. 3 circuit diagram).

The free end 43 of the blade 4 constituting one of the plates of the capacitor is preferably wider than the portion 42 constituting the flexible portion of the blade, and a load 5 of relatively large mass and likewise made, for example, of polycrystaline silicon extending over a height, for example, of about 10 microns, is disposed on the blade 4 in the vicinity of its free end 43 in order to increase the sensitivity of the cantilevered blade.

Under the effect of an acceleration, the blade 4 deforms and varies the distance across the empty space 6 between the free end 43 carrying the load 5 and the free surface of the sensor. As a result, by varying the capacitance of the variable capacitor 11, there is a transfer of charge to the grid 21 of the JFET 12 which thus modulates the drain-source current between the zones 22 and 23.

The use of a JFET 12 made in the vicinity of the anchor zone 21 of the flexible blade 4, makes it possible to reduce the noise which is inherent to electronic devices that include MOS transistors, and also to limit the drift of the device over time. Making the blade 4 out of a conductive material such as polycrystaline silicon also turns out to be more satisfactory than using metal blades or blades comprising both insulating material and a conductive core as in most prior art sensors.

Figure 2:
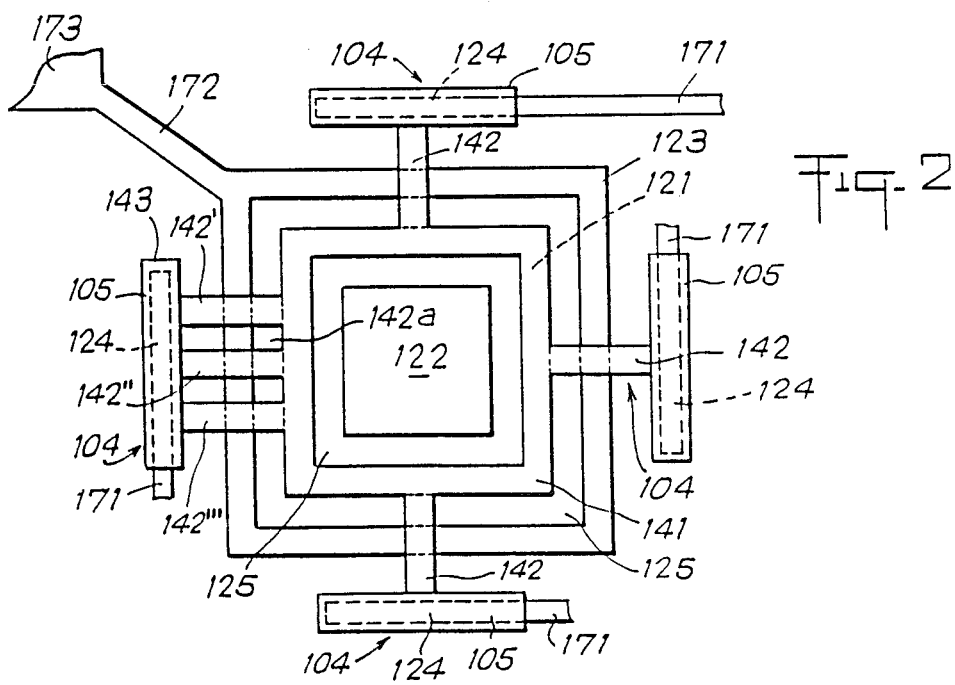
FIG. 2 is a plan view showing a particular embodiment of a sensor having a ring structure.

FIG. 2 is a plan view of an integrated sensor of the FIG. 1 type in which the JFET is made in a ring configuration to prevent a portion of the drain-source current being influenced by the grid.

FIG. 2 thus shows a JFET which comprises a central doped zone 122 having a high concentration of N+type impurities suitable for constituting the drain or the source of the JFET. The central zone 122 is surrounded in non-contiguous manner by a gate zone 121 which is doped with p+type impurities. A peripheral source or drain doped zone 123 having a high concentration of N+type impurities surrounds the gate zone 121, again in non-contiguous manner. A channel zone 125 extends between the central zone 122 and the grid zone 121 beneath the gate 121 and between the grid zone 121 and the peripheral zone 123.

For example, the central zone 122 may extend over an area of about 100 um × 100 um, whereas the rings 121 and 123 surrounding the central zone 122 may have a radial width of about 10 microns. When the size of the central zone 122 is large enough, a contact may be connected directly to said zone. The contact 173 to the peripheral zone 123 is connected thereto via a conductive path 172.

In the FIG. 2 embodiment, a blade 104 having a cantilevered flexible portion 142 terminates with a widened free end portion 143 capped by a load 105. The anchor portion 141 of the blade 104 is itself in the form of a ring which is superposed over the gate zone 121 and which surrounds the central drain or source zone 122 of the JFET. A conductive zone 124 connected via a track 171 to a contact (not shown) is disposed on the free surface of the substrate facing the free end 143 of the blade 104 and extending beneath the blade. Although the ring type JFET sensor may include only one blade 104, FIG. 2 shows four flexible blades 104 extending radially outwardly from the anchor ring 141.

The presence of a plurality of flexible blades 104 disposed symmetrically about two planes $A_1$-$A_2$ and $A_3$-$A_4$ which are mutually perpendicular and perpendicular to the plane of FIG. 2 makes it possible to improve the performance of the sensor which is made more insensitive to transverse accelerations by virtue of the various symmetries. The sensitive axis of the FIG. 2 sensor which is intended to be perpendicular to the plane of the drawing is thus better defined with blades 104 which are identical and symmetrically disposed relative to planes passing through said axis, since the set of signals generated by the displacements of the various blades 103 can be processed to compensate for influences that are exerted along axes other than the main sensitivity axis of the sensor.

Further, the width of each flexible blade 4, 104 can be relatively large while including gaps 142a in order to increase the ratio between flexibility in the longitudinal direction and flexibility in the transverse direction. Thus, FIG. 2 shows one of the flexible blades 104 (to the left of the figure) in the form of three parallel tongues 142', 142", 142''' which are spaced apart and attached to the anchoring 141 at different points and which are interconnected at their free ends by a common end portion 143.

In the above description, it has been assumed that the blades 4 and 104 are cantilevered. However, a sensor in accordance with the invention may also comprise a symmetrical association of two or more sensors in which the free portions 43, 143 of the flexible blades 4, 104 are interconnected in order to form a single flexible blade which is anchored at a plurality of ends. In the FIG. 1 embodiment, such a single flexible blade sensor could thus have an axis of symmetry corresponding to the axis $X_1$-$X_2$ of FIG. 1.

In force measurement sensors including a cantilevered blade situated at a very small distance from the free surface of the substrate, i.e. defining a very small empty space 6 of about 1 or 2 microns across, there is always a risk of the cantilevered portion 42, 142 of the blade 4, 104 becoming stuck against the substrate by virtue of the attraction which is exerted between two zones having different types of doping. In addition, the cantilevered blade which is itself very thin, e.g. about 0.5 to 1 micron thick, is fragile, thereby making the fabrication of an integrated sensor difficult.

BEST METHOD OF MAKING THE INVENTION

There follows a description with reference to FIGS. 1 and 4 to 7 of an example of a manufacturing method suitable for limiting the risk of sensor breakage during fabrication.

Figure 4:
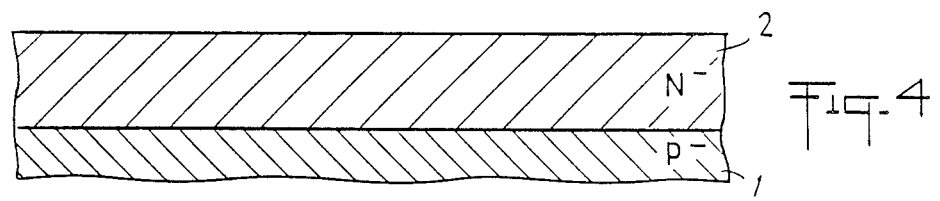
FIGS. 4 to 7 are diagrammatic section views showing various stages in the fabrication of the FIG. 1 sensor structure.

In a first, conventional stage shown in FIG. 4, a layer 2 of N type silicon is deposited by epitaxy on a P type substrate 1.

Figure 5:
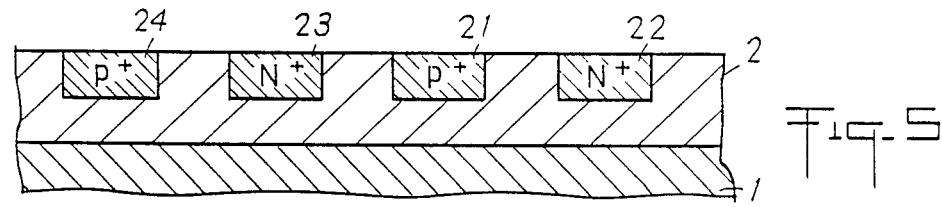

Surface oxidation is then performed and the oxide is photoetched in order to provide N+ zones 22 and 23 for the drain and the source of the JFET, followed by oxidation and etching in order to form the P+ zone 21 constituting the gate of the JFET and the p+ zone 24 constituting the fixed plate of the variable capacitor 11. These operations are, per se conventional and are not described in greater detail, with FIG. 5 showing the state of the silicon wafer after the above-mentioned stages have been performed.

Figure 6:
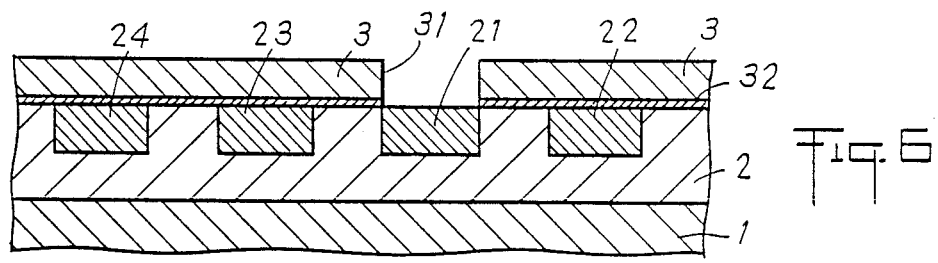

In a following stage, where appropriate, a passivation layer 32 is deposited followed by oxidation in order to form a layer 3 of silicon whose thickness corresponds to the desired width of the empty space 6 and a well 31 is engraved beneath the grid zone 21 for subsequent anchoring of the blade 4 (FIG. 6).

Figure 7:
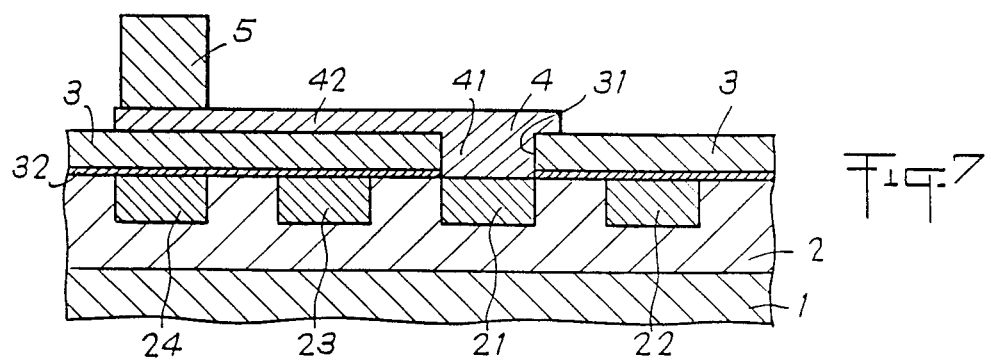

The stages shown in FIG. 7 are essentially constituted by depositing p+ doped polysilicon in the well 31 and on the $SiO_2$ layer 3, and then in etching the polysilicon in order to form the blade 4 with an anchor portion 41 and a portion 42 which is still supported by the layer 3 of $SiO_2$ but which is intended subsequently to be cantilevered.

The optional load 5 is then fabricated, and a certain number of operations which are not shown in the drawings are performed including opening contacts through the layer 3 of $SiO_2$ and the passivation layer 32 when present, depositing aluminum and photoetching the aluminum to provide conductive paths for connection purposes, cutting up the wafer, packaging the chips, and connecting aluminum contact wires to the tabs or connecting the tabs to macroscopic contacts.

These various operations are not novel per se but they are all performed while the blade 42 is still supported by the layer 3 of $SiO_2$. This prevents debris from becoming jammed beneath the blade 4 during the various cutting operations and it also prevents the mechanical strength of the blade being reduced since the blade remains supported by the layer of silicon oxide up to the tab-connection stage.

The final stage gives rise to the FIG. 1 structure, i.e it provides a small blade 4 which is cantilevered, and it consists in chemically etching the layer 3 including beneath the portion 42 of the blade 4 by means of a flow of gaseous anhydrous hydrofluoric acid at a temperature lying between about 50° C. and about 200° C., and preferably lying between 50° C. and 100° C., under conditions which prevent the formation of liquid droplets on the sensor chip. The oxide layer 3 may be etched, for example, at a speed of about 1 micron per minute.

Given the operating conditions of this last stage (hot etching under a flow of gas), the silica layer may be etched in dry manner without gelatinous redeposition, and the aluminum deposits are themselves substantially unaffected and retain their conductive properties.

Naturally, the above-described example of the manufacturing method may be subjected to numerous variants and all of the techniques normally used in microelectronics may be used.

Figure 8:
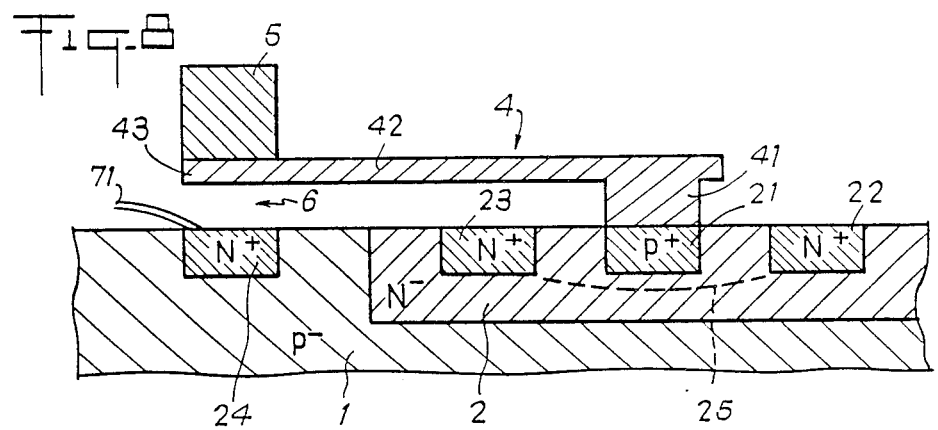
FIG. 8 is a diagrammatic section showing a variant embodiment of the FIG. 1 sensor.

Thus, the zones 21, 22, and 23, and where appropriate the conductive zone 24, may be doped equally well by diffusion or by ion implantation. The N-type layer 2 made on the P-type substrate 1 is not necessarily formed epitaxially. The N-type layer 2 surrounding the drain and source zones 22 and 23 may form a single box which does not extend as far as the conductive zone 24 situated facing the free end 43 of the blade 4 (FIG. 8). In this case, the conductive zone 24 which constitutes the fixed plate of the capacitor 11 connected to a connection 71 is made by doping with a high concentration of N+type impurities.

Further, in the embodiments described in the present patent application, it is naturally possible to invert the signs of all of the doped zones. Thus, in the description the first type of doping A, A+ may either be P-type or P+-type, while the second type of doping B, B+ is N-type or N+-type; however it is equally possible to consider the first type of doping A, A+ as being constituted by N-type or N+-type doping, in which case the second type of doping B, B+ should be considered as being B-type or B+-type.

It is already mentioned above that the cantilevered blade 4 of a force measurement sensor of the capacitive type having a very small empty space 6 may accidentally become stuck onto the free top surface of the substrate.

Figure 9:
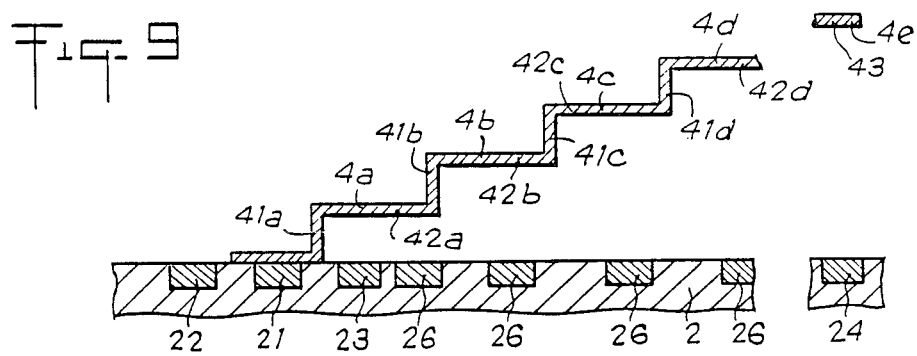
FIG. 9 is a diagrammatic section showing a second embodiment of the invention.
Figure 10:
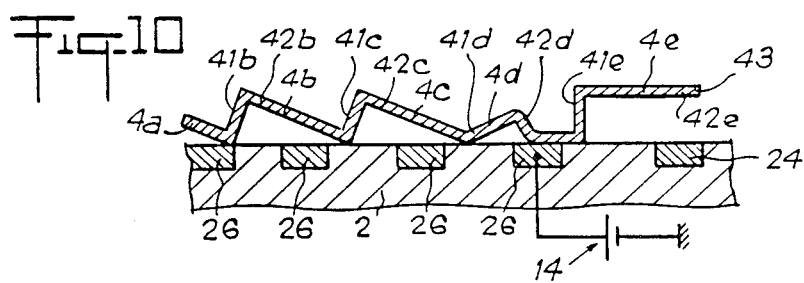
FIGS. 10 and 11 are views similar to FIG. 9 showing two successive stages in the state of the FIG. 9 sensor structure while unsticking the flexible blade of the sensor from the substrate.
Figure 11:
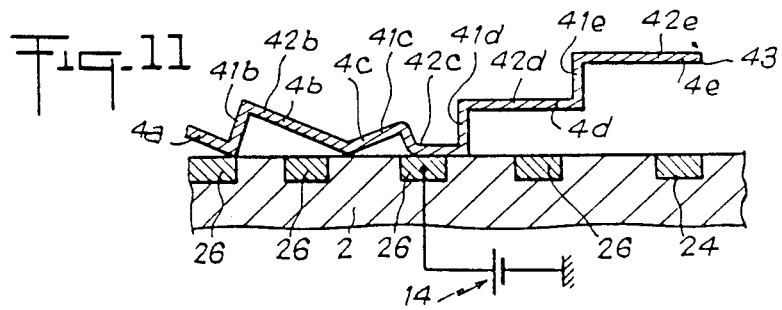

A particular embodiment shown in FIGS. 9 to 11 serves to remedy this drawback, and in the event of the cantilevered blade 4 becoming accidentally stuck, for example after the sensor has been subjected to a shock, it provides the possibility of returning the sensor to its initial state and thus avoids taking it out of service, since dismantling the sensor is not feasible.

The sensor shown in FIG. 9 shows the flexible blade 4 as a staircase comprising a set of successive "step" lengths 4a, 4b, ..., 4e. The first step 4a comprises a first anchoring "riser" portion 41a which is connected to a horizontal "tread" portion 42a which is cantilevered in a manner analogous to the blade 4 of FIGS. 1 and 8. A second "riser" portion 41b is disposed in the position of the load 5 of FIGS. 1 and 8 and constitutes the riser portion of step 4b whose "tread" portion 42b is situated at a higher distance above the free surface of the sensor than is the horizontal "tread" portion 42a of the first step 4a. The flexible blade 4 can thus comprise, for example, five successive steps 4a to 4e with risers 41a to 41e and with treads 42a to 42e and with the last tread 42e constituting the free end 43 of the blade and also constituting the moving plate of the capacitor 11 since it is situated over a conductive zone 24 which constitutes the fixed plate of the variable capacitor 11.

The first riser 41a which also constitutes the anchor zone extends above a doped zone 21 constituting the grid of the JFET 12, whose drain and source doped zones 22 and 23 surround the grid 21 without making contact therewith.

Each step 4a to 4e co-operates with a doped zone 26 having a high concentration of impurities and formed in the substrate 1 or in the epitaxial layer 2 above the substrate 1, and situated beneath the corresponding step.

The length of the horizontal "tread" portion 42a to 42e of each step 4a to 4e is less than a critical sticking length while the total length of the blade from its anchor riser portion 41a and the projection onto the substrate of the free end 43 is much greater than said critical sticking length.

The manner in which a staircase blade 4 of the type shown in FIG. 9 can easily be unstuck from the substrate by successively applying bias voltages to the doped zones 26 formed beneath the various steps 4a, ..., 4e of the staircase is now explained with reference to FIGS. 10 and 11.

Supposing that the blade 4 has become accidentally stuck, bias voltages are applied successively to the zones 26 beginning with the zone 26 that is situated beneath the step 4d which is immediately adjacent to the step 4e that is in turn adjacent to the free end 43 of the blade (see FIG. 10). The effect of applying a force on the step 4d by means of the bias voltage from the source 14 as exerted on the corresponding zone 26 serves to increase the length of the stuck portion of the tread portion 42d of the step 4d, thereby tending to raise the following step 4e which is adjacent to the free end 43. The step 4e can thus be unstuck, as shown in FIG. 10 while the steps 4a to 4d remain stuck.

By switching the bias voltage source 14 successively to step 4c (FIG. 11) then 4b, and then 4a, it is possible to unstick the various steps 4d, 4c and 4b. The last step whose length is less than the critical sticking length will itself automatically become unstuck when no further bias voltage is applied to any of the zones 26.

For example, a polysilicon blade 4 may comprise four steps each having a length of about 40 microns and a thickness of about 2 microns. The bias voltage which is applied successively to the the doped zones 26 may be about 10 volts.

INDUSTRIAL APPLICATION

The invention is particularly intended for making accelerometers or pressure sensors.

We claim:

1. A force measurement sensor integrated on silicon, comprising:
   a mono-crystalline silicon substrate having a first dopant and covered on at least a portion of its surface by a doped layer having a second dopant;
   a variable capacitor comprising a first moving plate including a flexible conducting blade having a free end which is deformable by bending, said plate having an "anchor portion applied to a localized zone of said doped layer, and which is mounted so as to have a cantilevered portion including a set of staircase steps, each staircase step being shorter than a critical sticking length and co-operating with a doped zone having a high concentration of impurities situated beneath said step and capable of being individually biased, and a fixed second plate including a conducting zone made on said doped layer, said conducting zone facing said first plate and separated therefrom by an empty space which is a few microns across;
   a first doped zone which is doped with a high concentration of said first dopant and which is situated in said doped layer, the anchor portion being located on said first doped zone in order to constitute the gate of a junction field effect transistor (JFET);

second and third doped zones which are doped with a high concentration of said second dopant situated on either side of said first doped zone to constitute the drain and source zones of the JFET, the doped layer defining a zone having a low concentration of said second dopant situated beneath said first doped zone between said second and third doped zones in order to constitute the channel of said JFET whose gate is directly connected via the flexible blade to the moving plate of the variable capacitor; and means for detecting a signal representative of variations in the position of said flexible blade.

2. A sensor according to claim 1, wherein means are provided for successively applying a bias voltage to each individually biasable doped zone going from zone to zone of the flexible blade starting with the free end thereof, thereby enabling successive steps to be unstuck in the event of the free portion of the flexible blade becoming accidentally stuck to the substrate.

3. A sensor according to claim 1 wherein said JFET forms a ring with said drain or source second zone constituting a central zone, said gate first zone surrounding the central drain or source zone in non-contiguous manner, said source or drain third zone itself surrounding the gate first zone in noncontiguous manner, said peripheral conductive zone being disposed in noncontiguous manner outside the source or drain third zone, and said channel zone being situated in the gaps between the second and first zones, between the first and third zones, and beneath said zones, and wherein the flexible blade has a cantilevered portion which extends radially outwardly from the first zone towards the conductive zone.

4. A sensor according to claim 3, further including a plurality of flexible blades extending radially outwardly from an anchor zone constituted by a ring superposed over the first zone, and conductive zones which are equal in number to the number of flexible blades and which are mutually noncontiguous with respective free end terminal portions of the flexible blades extending thereover.

5. A sensor according to claim 4, wherein the flexible blades are disposed symmetrically relative to two mutually perpendicular planes.

6. A sensor according to claim 1, wherein the blade has a widened portion at said free end of the conducting blade, said widened portion being suitable for having a load disposed thereon.

7. A sensor according to claim 1, wherein the flexible conducting blade is relatively long in comparison with its width and includes gaps in order to increase the ratio between its flexibility in the longitudinal direction and its flexibility in the transverse direction.

* * * * *